(12) United States Patent
Huang

(10) Patent No.: US 10,181,472 B1
(45) Date of Patent: Jan. 15, 2019

(54) MEMORY CELL WITH VERTICAL TRANSISTOR

(71) Applicant: Nanya Technology Corporation, New Taipei (TW)

(72) Inventor: Ching-Chia Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/794,794

(22) Filed: Oct. 26, 2017

(51) Int. Cl.
*H01L 27/108* (2006.01)
*H01L 29/78* (2006.01)

(52) U.S. Cl.
CPC .... *H01L 27/10829* (2013.01); *H01L 29/7827* (2013.01)

(58) Field of Classification Search
CPC ............... H01L 27/10829; H01L 29/7827
USPC ..................................................... 257/302
See application file for complete search history.

(56) References Cited

U.S. PATENT DOCUMENTS

2004/0232466 A1* 11/2004 Birner ............... H01L 27/10864
257/303
2005/0117442 A1* 6/2005 Sommer ............... G11C 11/404
365/232

FOREIGN PATENT DOCUMENTS

TW          522506 B      3/2003
TW        201112401 A     4/2011

* cited by examiner

*Primary Examiner* — Tu-Tu V Ho
(74) *Attorney, Agent, or Firm* — Muncy, Geissler, Olds & Lowe, P.C.

(57) ABSTRACT

The present disclosure provides a memory cell. The memory cell includes a substrate, a deep trench capacitor formed in the substrate, and a vertical transistor formed on the substrate and electrically connected to the deep trench capacitor. The vertical transistor includes a source region and a drain region stacked on the substrate, a channel region vertically sandwiched between the source region and the drain region, and a gate structure annularly wrapping around the channel region.

14 Claims, 3 Drawing Sheets

MEMORY CELL WITH VERTICAL TRANSISTOR

TECHNICAL FIELD

The present disclosure relates to a memory cell with a vertical transistor, and more particularly, to a dynamic random access memory (DRAM) cell with a vertical gate-all-around (GAA) transistor.

DISCUSSION OF THE BACKGROUND

A DRAM cell typically includes a metal-oxide-semiconductor field effect transistor (MOSFET) and a capacitor that are built in or on a semiconductor silicon substrate. As semiconductor integration continues to increase, device dimensions are necessarily decreased accordingly so as to all manufacture of DRAM devices with larger memory capacities and higher processing speeds.

Because three-dimensional (3D) capacitor structures are being made smaller and smaller, and therefore occupying smaller areas of the semiconductor substrate, the 3D capacitor, such as a deep trench capacitor, is applied to the fabrication of the DRAMs of 64 megabytes and above. However, for a conventional DRAM cell, although the capacitor has been designed in three dimensions, the transistor is still designed in two dimensions, and the transistor covers quite a few areas of the semiconductor substrate and cannot satisfy the need for high integration. Therefore the integration of DRAM cell array is limited.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a memory cell. The memory cell includes a semiconductor substrate, a deep trench capacitor formed in the semiconductor substrate, and a vertical transistor formed on the semiconductor substrate and electrically connected to the deep trench capacitor. The vertical transistor includes a source region and a drain region stacked on the substrate, a channel region vertically sandwiched between the source region and the drain region, and a gate structure annularly wrapping around the channel region.

In some embodiments, the deep trench capacitor includes a buried plate, a storage node, and a node dielectric layer sandwiched between the buried plate and the storage node.

In some embodiments, the memory cell further includes a diffusion region formed in the substrate, and the diffusion region is electrically connected to the storage node of the deep trench capacitor and the source region of the vertical transistor.

In some embodiments, a doping concentration of the diffusion region, a doping concentration of the source region, and a doping concentration of the drain region are substantially the same.

In some embodiments, a depth of the deep trench capacitor is at least twenty times a height of the vertical transistor.

In some embodiments, the source region, the drain region and the channel region include an epitaxial semiconductor structure.

In some embodiments, the gate structure includes a gate conductive layer and a gate dielectric layer sandwiched between the gate conductive layer and the channel region.

In some embodiments, the gate conductive layer includes a semiconductor layer.

In some embodiments, the channel region is vertically spaced apart from the substrate by the source region.

In some embodiments, a height of the drain region is greater than a height of the channel region and a height of the source region.

In some embodiments, the memory cell further includes a bit line electrically connected to the drain region of the vertical transistor.

In some embodiments, the memory cell further includes a contact structure electrically connecting the bit line and the drain region.

In some embodiments, the contact structure is formed on a top of the drain region.

In some embodiments, the contact structure annularly wraps around at least a portion of a sidewall of the drain region.

In the present disclosure, the memory cell is constructed by the deep trench capacitor formed in the substrate and the vertical transistor formed on the substrate. Further, the vertical transistor is a vertical gate-all-around (GAA) transistor. Accordingly, a high-performance transistor is obtained because carrier mobility is improved, and better electrical control over the channel region is achieved because channel leakage current is suppressed. Additionally, capacitance of the deep trench capacitor is reduced because the vertical GAA transistor exhibits less charge sharing.

Notably, the vertical GAA transistor is a 3D device that is more compact than conventional planar transistors. Thus, higher transistor density is enabled.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
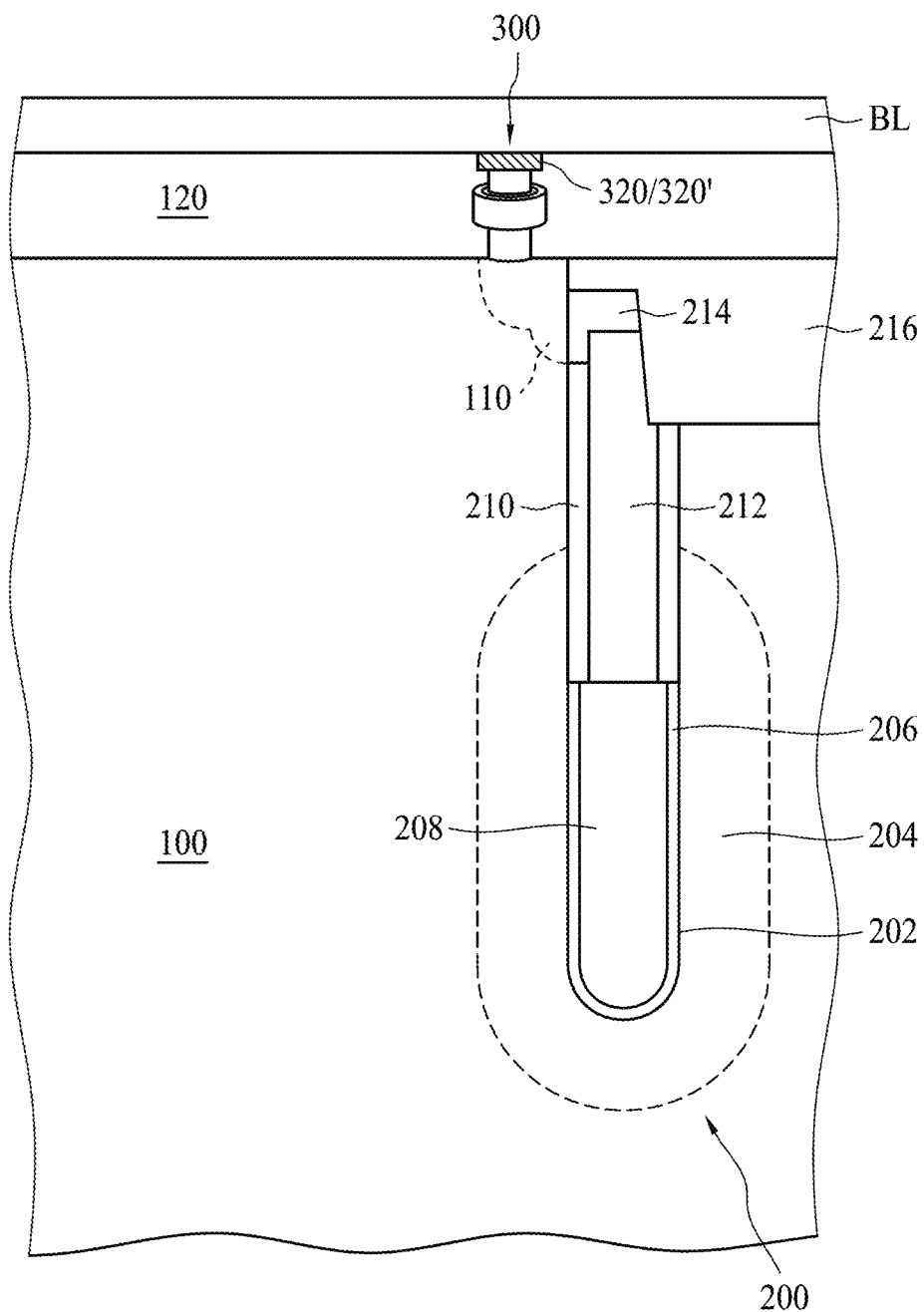
FIG. 1 is a cross-sectional view of a memory cell in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
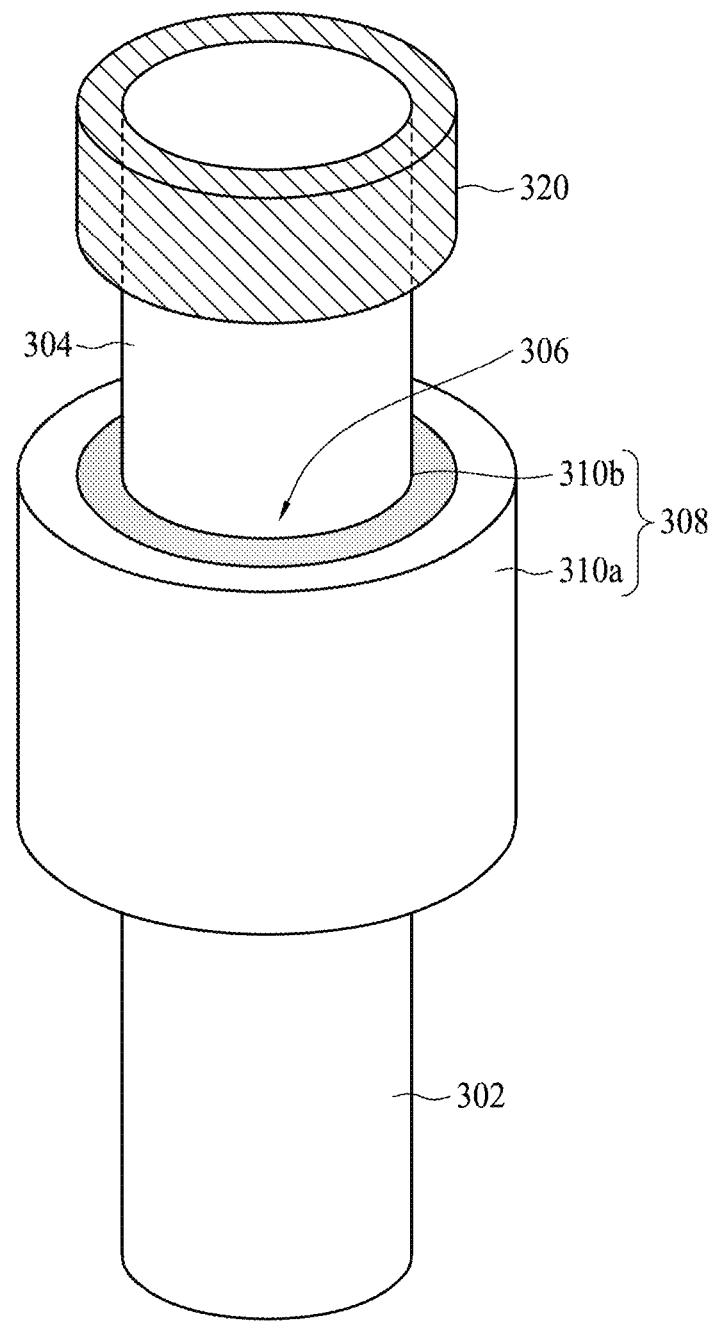
FIG. 2 is an enlarged partial view of the memory cell in accordance with some embodiments of the present disclosure.
Figure 3:
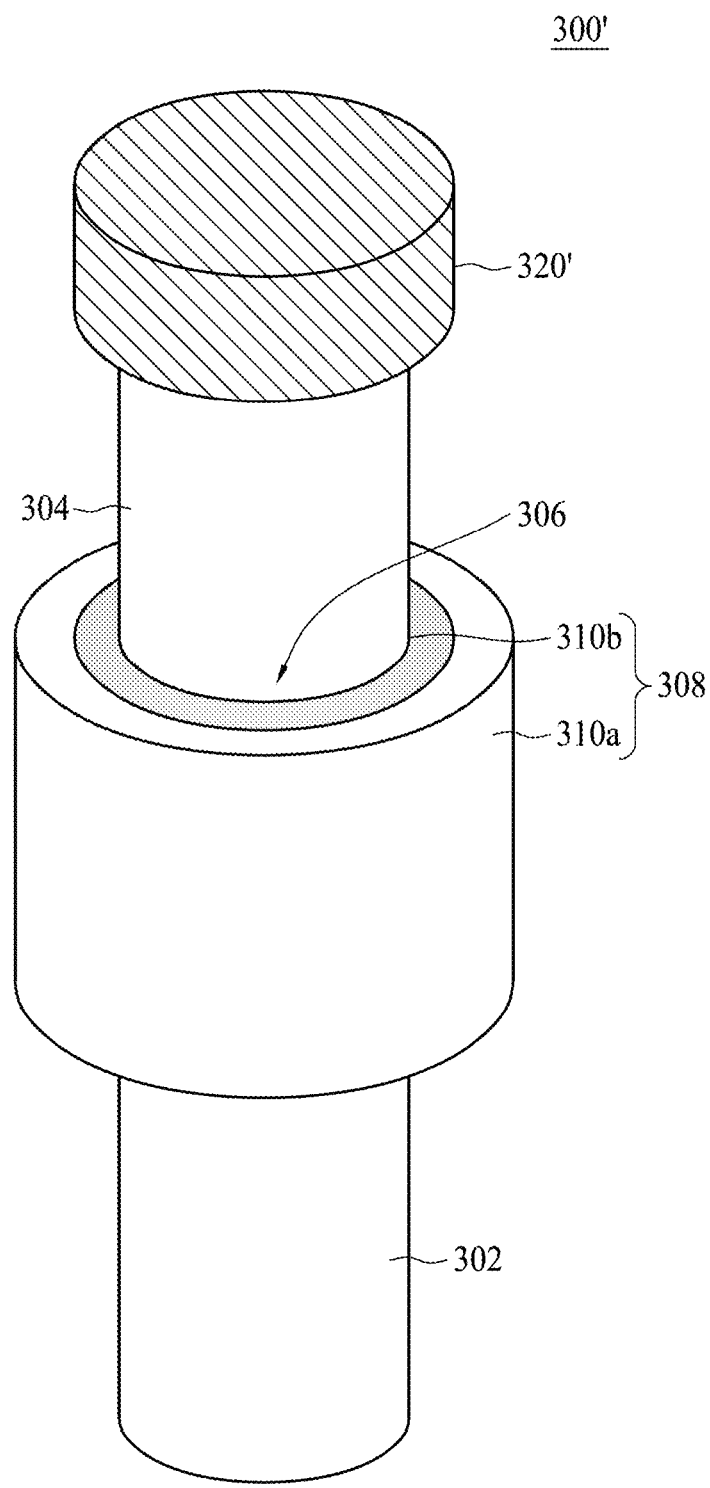
FIG. 3 is an enlarged partial view of the memory cell in accordance with some embodiments of the present disclosure.

FIG. 1 is a cross-sectional view of a memory cell 10 in accordance with some embodiments of the present disclosure, and FIGS. 2 and 3 are enlarged partial views of a vertical transistor 300 and a contact structure 320 and 320' of the memory cell 10 in accordance with some embodiments of the present disclosure. It should be easily understood that same elements in FIGS. 1 to 3 are designated by the same numerals.

Referring to FIG. 1, the memory cell 10 includes a substrate 100, a deep trench capacitor 200 formed in the substrate 100, and a vertical transistor 300 formed on the substrate 100. It is worth noting that the vertical transistor 300 is electrically connected to the deep trench capacitor 200 according to the embodiments of the present disclosure. Still referring to FIG. 1, a dielectric structure 120 such as an interlayer dielectric layer (ILD) is formed on the substrate 100 and the vertical transistor 300 is embedded in the dielectric structure 120. The memory cell 10 further includes a bit line BL formed on the dielectric layer structure 120, and the vertical transistor 300 is electrically connected to the bit line BL.

Referring to FIG. 1, the substrate 100 can include a semiconductor material such as silicon (Si) or germanium (Ge). The substrate 100 can be made by epitaxial silicon or silicon on insulator (SOI). In some embodiments, a p-type semiconductor Si substrate can be taken as an example. The deep trench capacitor 200 formed in the substrate 100 can be formed by the following steps, but the disclosure is not limited to this. In some embodiments, a pad oxide layer (not shown), a pad nitride layer (not shown), and a borophosphosilicate glass (BPSG) layer (not shown) are sequentially formed on the substrate 100. Next, photolithography and etching processes are performed. Consequently, a deep trench 202 is formed in the substrate 100. As shown in FIG. 1, the deep trench 202 is vertically and downwardly extended into the substrate 100. In some embodiments, a depth of the deep trench can be about 4.8 micrometers (μm), but the disclosure is not limited to this. Next, a heavily-doped n-type diffusion region 204 serving as a buried plate 204 of the deep trench capacitor 200 is formed in a lower portion of the deep trench 202 as shown in FIG. 1. Then, a node dielectric layer 206 such as a silicon nitride (SiN) layer, a silicon oxide (SiO) layer or a silicon oxynitride (SiON) layer, and a polysilicon layer 208 with n+-type dopants used as a storage node 208, are formed in the lower portion of the deep trench 202. As also shown in FIG. 1, the node dielectric layer 206 is sandwiched between the buried plate 204 and the storage node 208. Since the steps for forming the buried plate 204, the node dielectric layer 206 and the storage node 208 are well-known to those skilled in the art, and the details are omitted in the interest of brevity.

Still referring to FIG. 1, after completing the deep trench capacitor 200, a collar oxide layer 210 is formed on the sidewall of the middle portion of the deep trench 202. Next, another polysilicon layer 212 with n+-type dopants is formed to fill the opening surrounded by the collar oxide layer 210. Next, still another polysilicon layer 214 is formed to cover the polysilicon layer 212 and the collar oxide layer 210. Subsequently, a shallow trench isolation (STI) structure 216 is formed in the substrate 100. As shown in FIG. 1, the STI structure 216 covers and contacts a portion of the polysilicon layer 212, a portion of the collar oxide layer 210, and a portion of the polysilicon layer 214. In some embodiments, a top surface of the STI structure 216 and a top surface of the substrate 202 are co-planar.

A diffusion region 110 is formed in the substrate 100 near the top portion of the deep trench 202 for connecting the deep trench capacitor 12 to a device. Thus, the diffusion region 110 can be referred to as a node junction. In some embodiments, by using thermal annealing, the n+-dopants of the polysilicon layer 212 can diffuse into the substrate 100 through the polysilicon layer 214 to form the diffusion region 110. Thus, the polysilicon layer 214 is referred to as a buried strap 214.

Referring to FIGS. 1 to 3, the memory cell 10 further includes the vertical transistor 300 formed on the substrate 100. In some embodiments, the depth of the deep trench capacitor 200 is at least twenty times a height of the vertical transistor 300. In some embodiments, the height of the vertical transistor 300 is about 200 nanometers (nm), but the disclosure is not limited to this. Referring to FIGS. 2 and 3, the vertical transistor 300 can include a wire structure vertically grown on the substrate 100, and the vertical wire structure can include semiconductor material. In some embodiments, the semiconductor material can include Si; Ge; SiGe; a III-V compound such as gallium arsenide (GaAs), indium gallium arsenide (InGaAs), gallium nitride (GaN), or indium phosphide (InP); or any combination thereof. The vertical wire structure can be formed by molecular beam epitaxy (MBE) technique. Further, by adding impurities to the source gas, a uniformly doped vertical wire structure can be obtained. For example, a source layer is deposited, a channel layer is deposited on the source layer, and a drain layer is deposited on the channel layer. The source layer, the channel layer and the drain layer are then etched to formed the vertical wire structure having a longitudinal axis perpendicular to a surface plane of the substrate 100. Consequently, the vertical transistor 300 includes a source region 302 and a drain region 304 vertically stacked on the substrate, and a channel region 306 vertically sandwiched between the source region 302 and the drain region 304 as shown in FIGS. 2 and 3. The source region 302 and the drain region 304 can include epitaxial semiconductor material. Further, the channel region 306 is vertically spaced apart from the substrate 100 by the source region 302. In some embodiments, a height of the drain region 304 is greater than a height of the channel region 306 and a height of the source region 302, but the disclosure is not limited to this. For example, in some embodiments, the height of the drain region 304 is about 100 nm, and both the channel region 306 and the source region 302 are about 50 nm, but the disclosure is not limited to this.

A gate structure 308 is formed to annularly wrap around the channel region 306 as shown in FIGS. 2 and 3. It is worth noting that the channel region 306 is the region vertically between the source region 302 and the drain region 304 and wrapped by the gate structure 308. The gate structure 308 includes a gate conductive layer 310a and a gate dielectric layer 310b sandwiched between the gate conductive layer 310a and the channel region 306. In other words, the gate conductive layer 310a and the gate dielectric layer 310b coaxially wrap around the channel region 306. The gate dielectric layer 310b can include any suitable dielectric material or combination of such materials, using any of a wide range of suitable techniques. For example in some embodiments, the gate dielectric layer 310a can include hafnium oxide ($HfO_2$), zirconium oxide ($ZrO_2$), tantalum oxide ($Ta_2O_5$), silicon oxide ($SiO_2$), aluminum oxide ($Al_2O_3$), titanium oxide ($TiO_2$), lanthanum oxide ($La_2O_3$), hafnium silicate ($HfSiO_4$), zirconium silicate ($ZrSiO_4$), strontium titanate ($SrTiO_3$), or any combination thereof. It should be noted, however, that the present disclosure is not limited thereto, as, in accordance with some embodiments, the gate dielectric layer 310b can include any dielectric material, e.g., low-k dielectric, high-k dielectric, or other dielectric material, as desired for a given application. The gate conductive layer 310a can include a semiconductor layer. However, in some embodiments, the gate conductive layer 310a can include metal layers.

Referring back to FIG. 1, the vertical transistor 300 is electrically connected to the deep trench capacitor 200 as described above. Specifically, the source region 302 is electrically connected to the storage node 208 of the deep trench capacitor 200 through the diffusion region 110 and the polysilicon layers 212 and 214. In other words, the diffusion region 110 is electrically connected to the storage node 208 of the deep trench capacitor 200 and the source region 302 of the vertical transistor 300. As mentioned above, the source region 302 and the drain region 304 can be doped during deposition; therefore, the source region 302 and the drain region 304 can include a same conductivity type with the diffusion region 110. Further, a doping concentration of the diffusion region 110, a doping concentration of the source region 302, and a doping concentration of the drain region 304 are substantially the same.

Referring to FIGS. 2 and 3, the vertical transistor 300 is electrically connected to the bit line BL, as mentioned above. In some embodiments, the memory cell 10 further includes a contact structure 320 or 320', and the drain region 304 of the vertical transistor 300 is electrically connected to the bit line BL through the contact structure 320 or 320'. The contact structures 320 and 320' can include any suitable conductive material or combination of such materials, using any of a wide range of suitable techniques. For example the contact structures 320 and 320' can include tungsten (W), copper (Cu), cobalt (Co), molybdenum (Mo), rhodium (Rh), beryllium (Be), chromium (Cr), manganese (Mn), aluminum (Al), ruthenium (Ru), palladium (Pd), nickel (Ni), cobalt tungsten phosphide (CoWP), cobalt tungsten boron (CoWB), copper germanium (CuGe), Si, or any alloy or other combination thereof, but the disclosure is not limited to this. Referring to FIG. 2, in some embodiments, the contact structure 320 is a cap-like structure. The cap-like contact structure 320 wraps around at least a portion of a sidewall of the drain region 304, as shown in FIG. 2. Referring to FIG. 3, in some embodiments, the contact structure 320' covers the top surface of the drain region 304, but exposes the sidewall of the drain region 304.

In the present disclosure, the memory cell 10 is constructed by the deep trench capacitor 200 formed in the substrate 100 and the vertical transistor 300 formed on the substrate 100. Further, the vertical transistor 300 is a vertical gate-all-around (GAA) transistor. Accordingly, a high-performance transistor is obtained because carrier mobility is improved, and better electrical control over the channel region 306 is achieved because channel leakage current is suppressed. Additionally, capacitance of the deep trench capacitor 200 is reduced because the vertical GAA transistor 300 exhibits less charge sharing.

Notably, the vertical GAA transistor is a 3D device that is more compact than conventional planar transistors. Thus, higher transistor density is enabled.

One aspect of the present disclosure provides a memory cell. The memory cell includes a substrate, a deep trench capacitor formed in the substrate, and a vertical transistor formed on the substrate and electrically connected to the deep trench capacitor. The vertical transistor includes a source region and a drain region stacked on the substrate, a channel region vertically sandwiched between the source region and the drain region, and a gate structure annularly wrapping around the channel region.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A memory cell comprising:
   a substrate;

a deep trench capacitor formed in the substrate, wherein the deep trench capacitor comprises a buried plate, a storage node and a node dielectric layer sandwiched between the buried plate and the storage node; and a vertical transistor formed on the substrate and electrically connected to the deep trench capacitor, the vertical transistor comprising:

a source region and a drain region vertically stacked on the substrate;

a channel region vertically sandwiched between the source region and the drain region;

a gate structure annularly wrapping around the channel region; and a diffusion region formed in the substrate, and electrically connected to the storage node of the deep trench capacitor and the source region of the vertical transistor.

2. The memory of claim 1, wherein the substrate comprises a first conductivity type; the source region, the drain region and the diffusion region comprise a second conductivity type; and the first conductivity type is complementary to the second conductivity type.

3. The memory cell of claim 2, wherein a doping concentration of the diffusion region, a doping concentration of the source region, and a doping concentration of the drain region are substantially the same.

4. The memory cell of claim 1, wherein the source region, the drain region and the channel region comprise an epitaxial semiconductor material.

5. The memory cell of claim 1, wherein a depth of the deep trench capacitor is at least twenty times a height of the vertical transistor.

6. The memory cell of claim 1, wherein the gate structure of the vertical capacitor comprises a gate conductive layer and a gate dielectric layer sandwiched between the gate conductive layer and the channel region.

7. The memory cell of claim 6, wherein the gate conductive layer comprises a semiconductor layer.

8. The memory cell of claim 1, wherein the channel region is vertically spaced apart from the substrate by the source region.

9. The memory cell of claim 1, wherein a height of the drain region is greater than a height of the channel region and a height of the source region.

10. The memory cell of claim 1, further comprising a bit line electrically connected to the drain region of the vertical transistor.

11. The memory cell of claim 10, further comprising a contact structure electrically connecting the bit line and the drain region.

12. The memory cell of claim 11, wherein the contact structure is formed on a top of the drain region.

13. The memory cell claim 11, wherein the contact structure annularly wraps around at least a portion of a sidewall of the drain region.

14. A memory cell comprising:

a substrate;

a deep trench capacitor formed in the substrate; and a vertical transistor formed on the substrate and electrically connected to the deep trench capacitor, the vertical transistor comprising:

a source region and a drain region vertically stacked on the substrate;

a channel region vertically sandwiched between the source region and the drain region;

a gate structure annularly wrapping around the channel region;

a bit line electrically connected to the drain region of the vertical transistor; and a contact structure electrically connecting the bit line and the drain region;

wherein the contact structure is formed on a top of the drain region;

wherein the contact structure annularly wraps around at least a portion of a sidewall of the drain region.

* * * * *